(12) United States Patent
Lee et al.

(10) Patent No.: US 11,145,716 B1
(45) Date of Patent: Oct. 12, 2021

(54) SEMICONDUCTOR DEVICES WITH LOW RESISTANCE GATE STRUCTURES

(71) Applicant: GLOBALFOUNDRIES U.S. INC., Santa Clara, CA (US)

(72) Inventors: Rinus Tek Po Lee, Ballston Lake, NY (US); Jiehui Shu, Dalian (CN)

(73) Assignee: GLOBALFOUNDRIES U.S. Inc., Santa Clara, CA (US)

(*) Notice: Subject to any disclaimer, the term of this patent is extended or adjusted under 35 U.S.C. 154(b) by 0 days.

(21) Appl. No.: 16/877,510

(22) Filed: May 19, 2020

(51) Int. Cl.
H01L 21/02 (2006.01)
H01L 21/3205 (2006.01)
H01L 21/8238 (2006.01)
H01L 29/06 (2006.01)
H01L 29/786 (2006.01)

(52) U.S. Cl.
CPC .... *H01L 29/0649* (2013.01); *H01L 21/02186* (2013.01); *H01L 21/3205* (2013.01); *H01L 21/823842* (2013.01); *H01L 29/78696* (2013.01)

(58) Field of Classification Search
CPC ....... H01L 29/0649; H01L 1121/02186; H01L 29/3205; H01L 29/823842
USPC .......................................................... 257/401
See application file for complete search history.

(56) References Cited

U.S. PATENT DOCUMENTS

| | | | |
|---|---|---|---|
| 6,777,761 B2 | 8/2004 | Clevenger et al. | |
| 8,637,390 B2 | 1/2014 | Ganguli et al. | |
| 2009/0072312 A1 | 3/2009 | Chang et al. | |
| 2013/0221436 A1* | 8/2013 | Hossain | H01L 29/7827 257/334 |
| 2017/0200652 A1* | 7/2017 | Kim | H01L 27/092 |
| 2019/0393077 A1* | 12/2019 | Chang | H01L 29/66795 |

* cited by examiner

*Primary Examiner* — Tong-Ho Kim
(74) *Attorney, Agent, or Firm* — David Cain (57) ABSTRACT

A structure comprises a substrate and a first gate structure and a second gate structure in a dielectric layer over the substrate. The first and second gate structures having a width, the width of the first gate structure is shorter than the width of the second gate structure. The first gate structure comprises a first gate conductor layer and the second gate structure comprises a second gate conductor layer. The first gate conductor layer is made of a different metal from the second gate conductor layer.

19 Claims, 8 Drawing Sheets

SEMICONDUCTOR DEVICES WITH LOW RESISTANCE GATE STRUCTURES

FIELD OF THE INVENTION

The disclosed embodiments relate generally to semiconductor devices, and more particularly, to short channel and long channel semiconductor devices with gate structures having reduced resistance and the manufacture thereof.

BACKGROUND

The majority of present day integrated circuits (ICs) are implemented by using a plurality of interconnected field-effect transistors (FETs). A FET generally includes a semiconductor substrate, a source, a drain and a gate structure. The gate structure comprises metal layers such as gate conductor layers, barrier layers and work function metal layers and a gate dielectric layer. When a voltage exceeding a threshold voltage is applied to the gate structure, an inversion or depletion layer is formed in a channel defined in the semiconductor substrate between the source and the drain, and carrier flow occurs between the source and drain to produce a device output current.

The integration of multiple devices in a single chip enables different functionalities for various applications. For example, a short channel device is typically used for high frequency applications whereas a long channel device is used for applications requiring low leakage current components. It is desirable to reduce gate resistance for both long channel and short channel devices for improved performance. A reduced gate resistance will lead to faster speed and lower power consumption for both short channel and long channel devices.

It is challenging to reduce gate resistance for both short channel and long channel devices. Tungsten metal has a low resistivity and is used as a gate conductor layer of gate structures for both short channel and long channel devices. Chemical vapor deposition (CVD) process is typically used to deposit the tungsten metal. CVD deposited tungsten contains fluorine which will attack underlying work function metal layers. A barrier layer such as titanium nitride is usually arranged between the tungsten gate conductor layer and the work function metal layer. Titanium nitride barrier layer has a high resistivity and will lead to higher gate resistance especially for short channel devices due to smaller gate conductor volume compared to long channel devices. Gate conductor volume of short channel devices will decrease further as device features scale down.

Thus, there is an urgent need for to overcome the challenges mentioned above.

SUMMARY

In an aspect of the present disclosure, a structure comprises a substrate and a first gate structure and a second gate structure in a dielectric layer over the substrate. The first and second gate structures having a width, the width of the first gate structure is shorter than the width of the second gate structure. The first gate structure comprises a first gate conductor layer and the second gate structure comprises a second gate conductor layer. The first gate conductor layer is made of a different metal from the second gate conductor layer.

In another aspect of the present disclosure, a structure comprises a substrate and a first gate structure and a second gate structure in a dielectric layer over the substrate. The first and second gate structures having a width, the width of the second gate structure is at least two times longer than the width of the first gate structure. The first gate structure comprises a first gate conductor layer and the second gate structure comprises a second gate conductor layer and a conductive barrier layer. The second gate conductor layer has side surfaces and a bottom surface. The conductive barrier layer is arranged next to the side surfaces and the bottom surface of the second gate conductor layer in the second gate structure. The first gate conductor layer is made of a different metal from the second gate conductor layer.

In yet another aspect of the present disclosure, a method of fabricating a structure is provided. The method comprises forming a first gate structure and a second gate structure in a dielectric layer over a substrate, the first gate structure having a shorter width than the second gate structure. The first gate structure comprises a first gate conductor layer and the second gate structure comprises a second gate conductor layer. The first gate conductor layer is made of a different metal from the second gate conductor layer.

Numerous advantages may be derived from the embodiments described below. The embodiments herein result in semiconductor devices with low resistance gate structures for both short channel and long channel devices. The low gate resistance leads to faster speed and lower power consumption. Simple and cost efficient methods of fabricating the devices are presented without the need of additional photolithographic masks.

BRIEF DESCRIPTION OF THE DRAWINGS

The disclosed embodiments will be better understood from a reading of the following detailed description, taken in conjunction with the accompanying drawings:

FIGS. 2 to 8 illustrate a fabrication process flow of the structure illustrated in FIG. 1, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1:
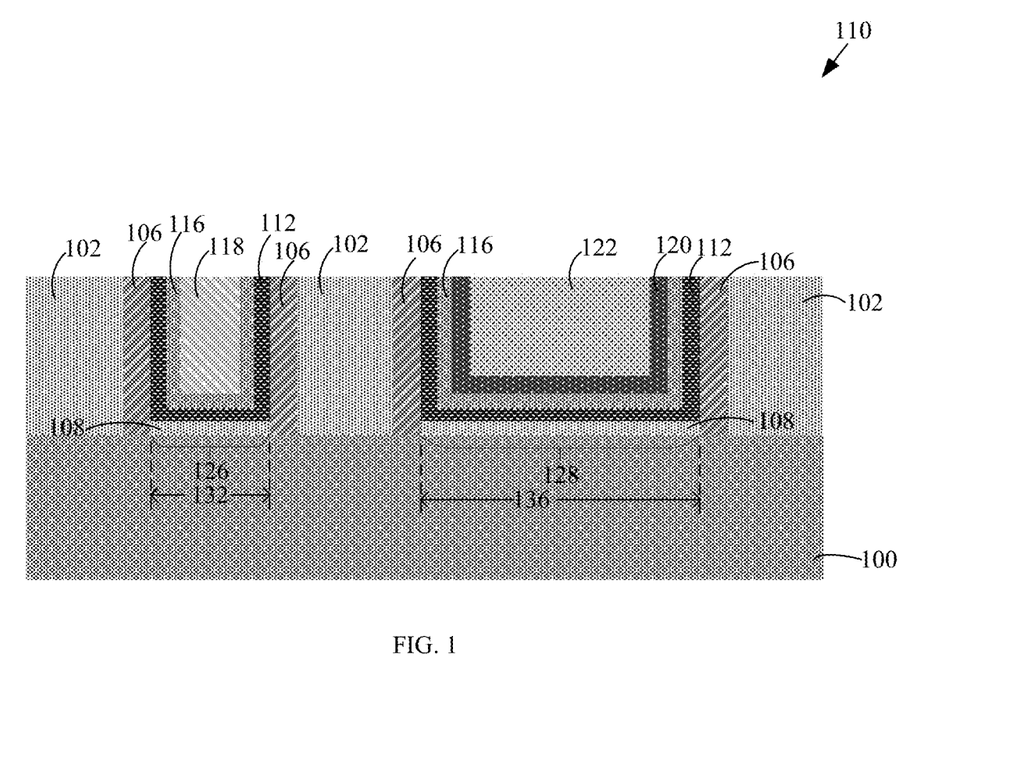
FIG. 1 is a cross-section view of a structure, according to embodiments of the disclosure.

FIG. 1 is a cross-section view of a structure 110, according to embodiments of the disclosure. The structure 110 depicted in FIG. 1 includes a first gate structure 126 and a second gate structure 128 in a dielectric layer 102. The first gate structure 126 may have a shorter width than the second gate structure 128. In embodiments, the first gate structure 126 and the second gate structure 128 refer to gate structures of short channel and long channel devices, respectively. The first gate structure 126 comprises a first gate conductor layer 118 and the second gate structure 128 comprises a second gate conductor layer 122. The first gate conductor layer 118 may be of a different metal from the second gate conductor layer 122. In embodiments, the first gate conductor layer 118 is made of cobalt or ruthenium. In embodiments, the second gate conductor layer 122 is made of tungsten. The term "gate conductor layer" may refer to a metal layer providing low resistance in a gate structure. In embodiments, the first gate conductor layer 118 occupies more than 40% and up to 80% of volume of the first gate structure 126.

The terms "long channel" and "short channel" are relative terms, but as used herein, the term "short channel" refers to a channel length that is approximately equal to the current technology minimum channel length that is allowed by the design rules of a specific processing technology generation, whereas the term "long channel" refers to a channel length that is at least 200 percent greater than the current technology minimum channel length that is allowed by the design rules of a specific processing technology generation. In embodiments, a width of a gate structure is approximately equal to a channel length thereby a width 136 of the second gate structure 128 is at least two times longer than a width 132 of the first gate structure 126. For example, the width 132 of the first gate structure 126 is in the range of about 15 nm to about 30 nm, while the width 136 of the second gate structure 128 is in the range of about 30 nm to about 300 nm.

Referring to FIG. 1, the structure 110 may include a substrate 100. In embodiments, the substrate 100 is a semiconductor fin. In further embodiments, the substrate 100 is a bulk semiconductor substrate or a semiconductor-on-insulator layer. The substrate 100 may be made of a semiconductor material such as silicon, germanium or silicon germanium. The first and second gate structures, 126 and 128, respectively, and the dielectric layer 102 may be disposed over the substrate 100.

The dielectric layer 102 may be an interlayer dielectric (ILD). The dielectric layer 102 may be made of a low dielectric constant (low-k) material. A low-k material has a dielectric constant lower than 7. Some examples of low-k materials include silicon dioxide, silicon oxynitride, borosilicate glass (BSG), phosphoric silicate glass (PSG) and fluorinated silicate glass (FSG).

The second gate structure 128 may include a conductive barrier layer 120. In embodiments, the conductive barrier layer 120 is arranged next to side surfaces and a bottom surface of the second gate conductor layer 122. The conductive barrier layer 120 may be made of titanium nitride. In embodiments, the second gate conductor layer 122 occupies more than 50% and up to 90% of volume of the second gate structure 128. A larger volume of the second gate conductor layer 122 in the second gate structure 128 may be easier to fabricate as it may prevent fabrication issues such as pinch-off.

The first gate conductor layer 118 may have a higher resistivity than the second gate conductor layer 122. For example, cobalt has a resistivity of approximately $5.6 \times 10^{-8}$ ohm meters while tungsten has a resistivity of approximately $4.9 \times 10^{-8}$ ohm meters. The conductive barrier layer 120 may have a higher resistivity than the first gate conductor layer 118. For example, titanium nitride has a resistivity of approximately $4.6 \times 10^{-6}$ ohm meters.

In further embodiments, the first and second gate structures, 126 and 128 respectively, include a work function metal layer 116. The work function metal layer 116 may be arranged next to side surfaces and a bottom surface of the first gate conductor layer 118 in the first gate structure 126. The work function metal layer 116 may be arranged next to side surfaces and a bottom surface of the conductive barrier layer 120 in the second gate structure 128. The work function metal layer 116 may include any metallic compound or a composition of metallic compounds having a suitable work function. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

The first and second gate structures, 126 and 128 respectively, may include a gate dielectric layer 112. The gate dielectric layer 112 may be arranged next to side surfaces and a bottom surface of the work function metal layer 116. The gate dielectric layer 112 may be made of a high dielectric constant (high-k) material. The term "high-k" as used herein refers to a material having a dielectric constant (i.e., k value) that is greater than 10. The high-k material may include, but is not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2.

The first and second gate structures, 126 and 128 respectively, may include an interfacial dielectric layer 108. The interfacial dielectric layer 108 may be arranged next to a bottom surface of the gate dielectric layer 112 thereby separating the gate dielectric layer 112 from the substrate 100. The interfacial dielectric layer 108 may be made of silicon dioxide. The interfacial dielectric layer 108 may form a bottom surface of the first gate structure 126 and the second gate structure 128.

Spacer structures 106 may be arranged on side surfaces of the first and second gate structures, 126 and 128 respectively. The spacer structures 106 may separate the first and second gate structures, 126 and 128 respectively, from the dielectric layer 102. The spacer structures 106 may be made of low-k dielectric materials including silicon nitride (SiN), silicon oxynitride (SiON), silicon oxycarbonitride (SiOCN), silicon carbonitride (SiCN), silicon oxycarbide (SiOC) or boron-doped silicon carbonitride (SiBCN). The term "low-k" as used herein refers to a material having a dielectric constant (i.e., k value) that is lower than 7.

Figure 2:
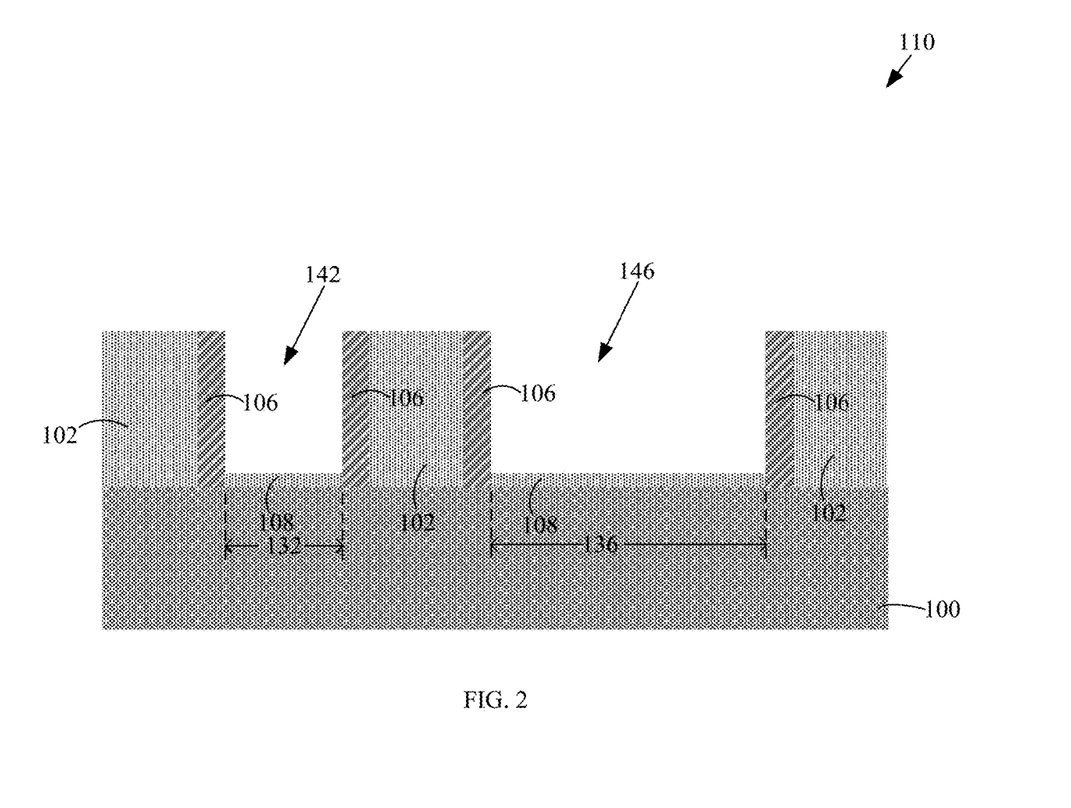
FIG. 2 is a cross-section view of a partially completed structure, according to embodiments of the disclosure.

FIGS. 2 to 8 illustrate a fabrication process flow of the structure 110 illustrated in FIG. 1, according to embodiments of the disclosure. FIG. 2 is a cross-section view of a partially completed structure 110, according to embodiments of the disclosure. Referring to FIG. 2, a structure 110 is provided, the structure 110 comprising a first trench 142 and a second trench 146 in a dielectric layer 102 over a substrate 100. The first trench 142 has a width 132 and the second trench 146 has a width 136. In embodiments, the width 136 of the second trench 146 is at least two times longer than the width 132 of the first trench 142. Spacer structures 106 form side surfaces of the first and second trenches, 142 and 146 respectively. The spacer structures 106 may be arranged on side surfaces of the dielectric layer 102. An interfacial dielectric layer 108 may be arranged between the spacer structures 106 thereby forming bottom surfaces of the first and second trenches, 142 and 146 respectively.

Figure 3:
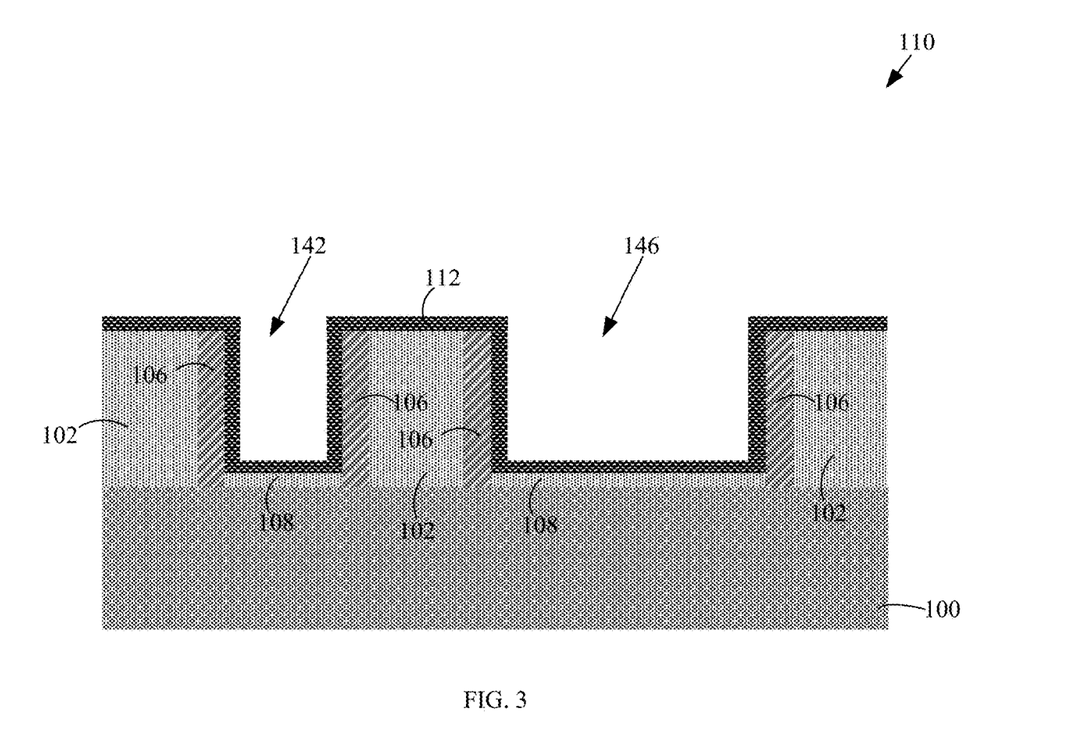
FIG. 3 is a cross-section view of a partially completed structure after formation of a gate dielectric layer, according to embodiments of the disclosure.

FIG. 3 is a cross-section view of a partially completed structure 110 after formation of a gate dielectric layer 112, according to embodiments of the disclosure. The gate dielectric layer 112 may be deposited over side surfaces and bottom surfaces of the first and second trenches 142 and 146, respectively. In embodiments, the gate dielectric layer 112 is deposited by atomic layer deposition (ALD), chemical vapor deposition (CVD), physical vapor deposition (PVD) or any other suitable deposition processes.

Figure 4:
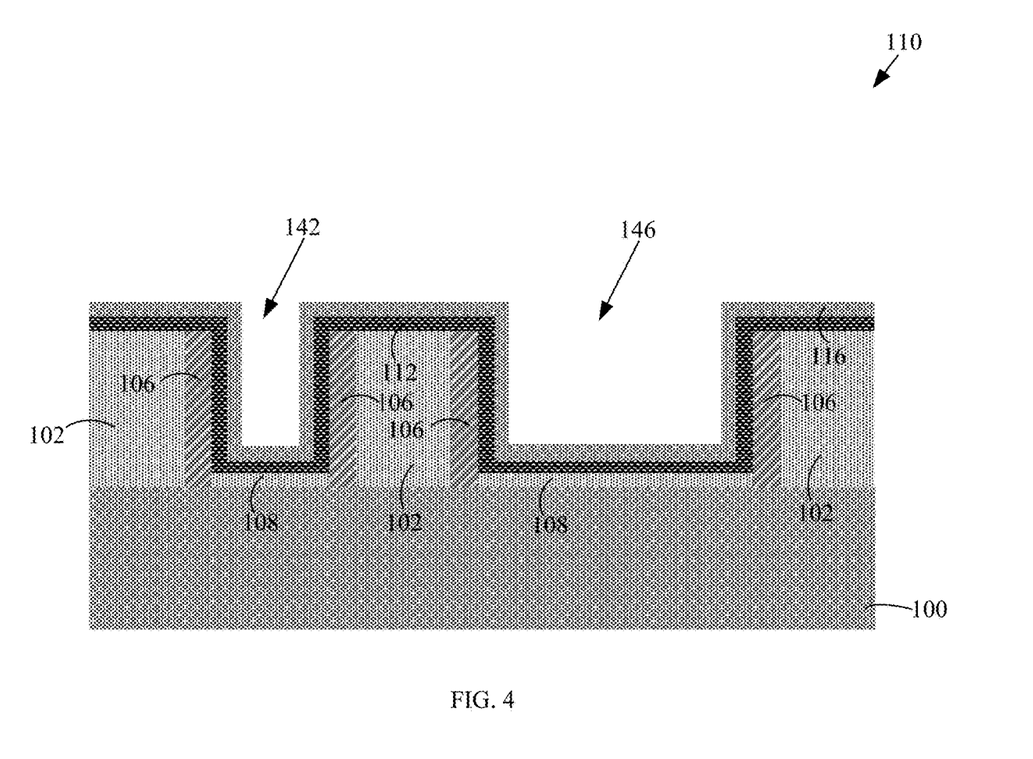
FIG. 4 is a cross-section view of a partially completed structure after formation of a work function metal layer, according to embodiments of the disclosure.

FIG. 4 is a cross-section view of a partially completed structure 110 after formation of a work function metal layer 116, according to embodiments of the disclosure. The work function metal layer 116 may be deposited over the gate dielectric layer 112 in the first and second trenches 142 and 146, respectively. In embodiments, the work function metal layer 116 is deposited by atomic layer deposition (ALD), chemical vapor deposition (CVD), physical vapor deposition (PVD) or any other suitable deposition processes.

Figure 5:
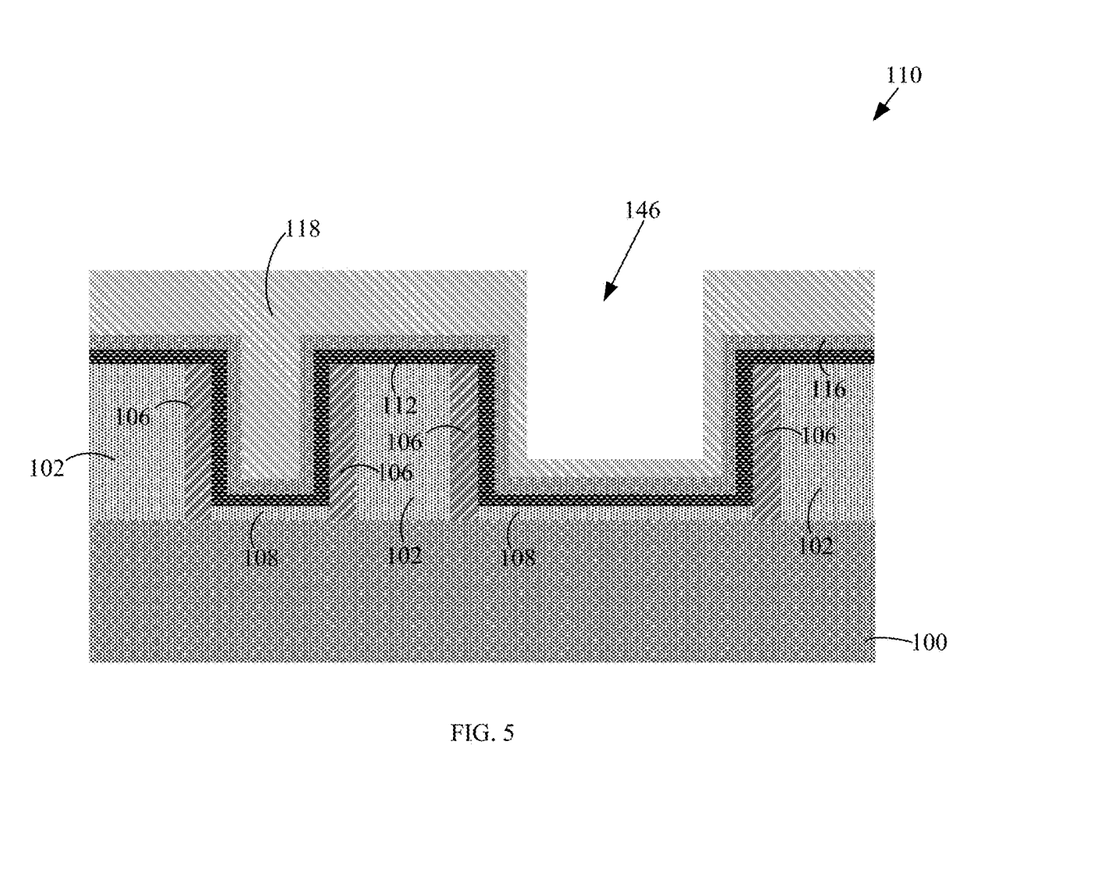
FIG. 5 is a cross-section view of a partially completed structure after deposition of a first gate conductor layer, according to embodiments of the disclosure.

FIG. 5 is a cross-section view of a partially completed structure 110 after deposition of a first gate conductor layer 118, according to embodiments of the disclosure. The first gate conductor layer 118 may be deposited over the work function metal layer 116 in the first and second trenches 142 and 146, respectively. The first gate conductor layer 118 fills up the first trench 142 as the first trench 142 has a narrower width than the second trench 146. In embodiments, the first gate conductor layer 118 is deposited by atomic layer deposition (ALD), chemical vapor deposition (CVD), physical vapor deposition (PVD) or any other suitable deposition processes.

Figure 6:
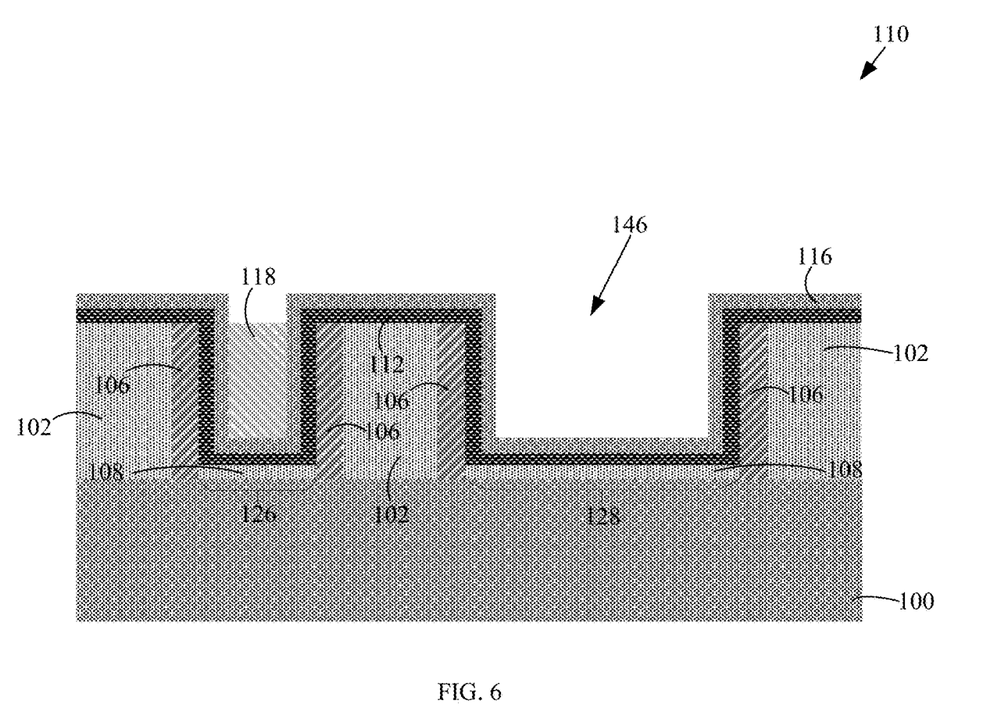
FIG. 6 is a cross-section view of a partially completed structure after removing the first gate conductor layer from a second trench, according to embodiments of the disclosure.

FIG. 6 is a cross-section view of a partially completed structure 110 after removing the first gate conductor layer 118 from the second trench 146, according to embodiments of the disclosure. The removal process of the first gate conductor layer 118 may also leave behind the first gate conductor layer 118 in the first trench 142, thereby forming a gate conductor layer of the first gate structure 126. The first gate conductor layer 118 may be removed by suitable wet chemical processes including dilute sulfuric peroxide (DSP).

Figure 7:
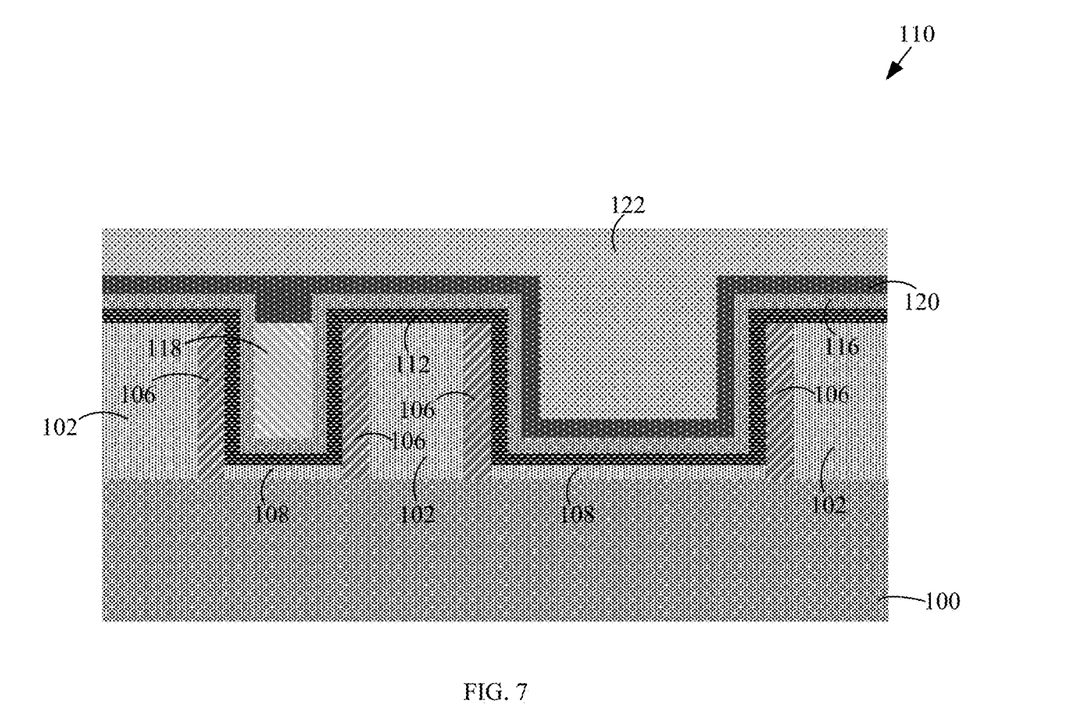
FIG. 7 is a cross-section view of a partially completed structure after depositing a barrier layer and a second gate conductor layer, according to embodiments of the disclosure.

FIG. 7 is a cross-section view of a partially completed structure 110 after depositing a barrier layer 120 and a second gate conductor layer 122 over the barrier layer 120, according to embodiments of the disclosure. The barrier layer 120 may be deposited over the first gate conductor layer 118 in the first trench 142 and over the work function metal layer 116 in the second trench 146. The second gate conductor layer 122 may be deposited over the barrier layer 120. In embodiments, the second gate conductor layer 122 is deposited over the first gate conductor layer 118 in the first trench and over the barrier layer 120 in the second trench thereby filling up the second trench 146. The second gate conductor layer 122 is deposited by CVD, ALD, PVD or any other suitable deposition processes.

Figure 8:
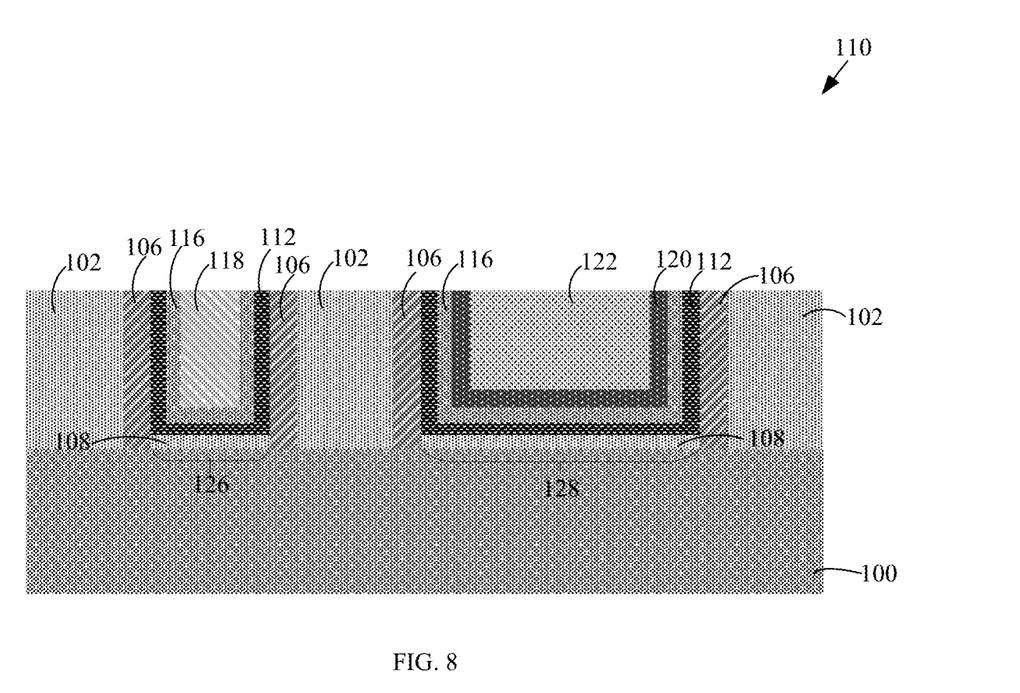
FIG. 8 is a cross-section view of a structure after removing the barrier layer and the second gate conductor layer over the first gate conductor layer in the first trench, thereby leaving behind the barrier layer and the second gate conductor layer in the second trench, according to embodiments of the disclosure.

FIG. 8 is a cross-section view of a structure 110 after removing the barrier layer 120 and the second gate conductor layer 122 over the first gate conductor layer 118 in the first trench 142, thereby leaving behind the barrier layer 120 and the second gate conductor layer 122 in the second trench 146, according to embodiments of the disclosure. The removal process is by chemical mechanical polishing (CMP) or any other suitable removal processes thereby forming a first gate structure 126 and a second gate structure 128 in a dielectric layer 102. The first gate structure 126 comprises a first gate conductor layer 118 and the second gate structure 128 comprises a second gate conductor layer 122. The first gate conductor layer 118 is made of a different metal from the second gate conductor layer 122.

Numerous advantages are achieved by the embodiments described above. The various embodiments result in at least 37% reduction in resistance for short channel devices and at least 12% reduction in resistance for long channel devices. Therefore the resistance of both short channel and long channel devices are reduced simultaneously.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the devices, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A structure comprising:
   a substrate;
   a first gate structure and a second gate structure in a dielectric layer over the substrate;
   the first and second gate structures having a width, wherein the width of the first gate structure is shorter than the width of the second gate structure;
   wherein the first gate structure comprises a first gate conductor layer and the second gate structure comprises a second gate conductor layer and a conductive barrier layer;
   wherein the first gate conductor layer is made of a different metal from the second gate conductor layer; and
   wherein the conductive barrier layer has a higher resistivity than the first gate conductor layer.

2. The structure of claim 1, wherein the first gate conductor layer is made of cobalt or ruthenium.

3. The structure of claim 2, wherein the second gate conductor layer is made of tungsten.

4. The structure of claim 1,
   wherein the conductive barrier layer is arranged next to side surfaces and a bottom surface of the second gate conductor layer.

5. The structure of claim 4, wherein the conductive barrier layer is made of titanium nitride.

6. The structure of claim 4 further comprising:
   a work function metal layer, wherein the work function metal layer is arranged next to side surfaces and a bottom surface of the first gate conductor layer in the first gate structure; and
   wherein the work function metal layer is arranged next to side surfaces and a bottom surface of the conductive barrier layer in the second gate structure.

7. The structure of claim 6 further comprising:
   a gate dielectric layer, wherein the gate dielectric layer is arranged next to side surfaces and a bottom surface of the work function metal layer.

8. The structure of claim 7 further comprising:
   an interfacial dielectric layer, wherein the interfacial dielectric layer is arranged next to a bottom surface of the gate dielectric layer; and
   the interfacial dielectric layer forms a bottom surface of the first gate structure and the second gate structure.

9. The structure of claim 1, wherein the second gate conductor layer occupies more than 50% and up to 90% of volume of the second gate structure.

10. The structure of claim 9, wherein the first gate conductor layer occupies more than 40% and up to 80% of volume of the first gate structure.

11. The structure of claim 1, wherein the first gate conductor layer has a higher resistivity than the second gate conductor layer.

12. A structure comprising:
    a substrate;
    a first gate structure and a second gate structure in a dielectric layer over the substrate;
    the first and second gate structures having a width, the width of the second gate structure is at least two times longer than the width of the first gate structure;
    wherein the first gate structure comprises a first gate conductor layer and the second gate structure comprises a second gate conductor layer and a conductive barrier layer;
    wherein the first gate conductor layer is made of a different metal from the second gate conductor layer; and
    wherein the conductive barrier layer has a higher resistivity than the first gate conductor layer.

13. The structure of claim 12, wherein the substrate comprises a semiconductor fin.

14. The structure of claim 12 further comprising:
    spacer structures arranged on side surfaces of the first gate structure and the second gate structure; and
    wherein the spacer structures separate the first gate structure and the second gate structure from the dielectric layer.

15. A method to fabricate a structure comprising:
    forming a first gate structure and a second gate structure in a dielectric layer over a substrate, the first gate structure having a shorter width than the second gate structure;
    wherein the first gate structure comprises a first gate conductor layer and the second gate structure comprises a second gate conductor layer and a conductive barrier layer;
    wherein the first gate conductor layer is made of a different metal from the second gate conductor layer; and
    wherein the conductive barrier layer has a higher resistivity than the first gate conductor layer.

16. The method of claim 15 further comprising:
    providing a first trench and a second trench in a dielectric layer over a substrate, the first trench having a shorter width than the second trench;
    forming a first gate conductor layer in the first trench; and
    forming a second gate conductor layer in the second trench.

17. The method of claim 16, wherein the formation of a first gate conductor layer in the first trench further comprises:
    depositing a first gate conductor layer in the first trench and the second trench; and
    removing the first gate conductor layer from the second trench leaving behind the first gate conductor layer in the first trench.

18. The method of claim 17, wherein the formation of a second gate conductor layer in the second trench further comprises:
    depositing the second gate conductor layer over the first gate conductor layer in the first trench;
    depositing the second gate conductor layer in the second trench; and
    removing the second gate conductor layer over the first gate conductor layer, leaving behind the second gate conductor layer in the second trench.

19. The method of claim 18 further comprising:
    depositing a barrier layer over the first gate conductor layer in the first trench and in the second trench prior to depositing the second gate conductor layer in the first and second trenches; and removing the barrier layer over the first gate conductor layer in the first trench leaving behind the barrier layer in the second trench.

* * * * *